US006459553B1

(12) United States Patent
Drapkin et al.

(10) Patent No.: US 6,459,553 B1
(45) Date of Patent: Oct. 1, 2002

(54) SINGLE GATE OXIDE ELECTROSTATIC DISCHARGE PROTECTION CIRCUIT

(75) Inventors: Oleg Drapkin, North York; Grigori Temkine, Toronto, both of (CA)

(73) Assignee: ATI International SRL, Barbados (KN)

( * ) Notice: Subject to any disclaimer, the term of this patent is extended or adjusted under 35 U.S.C. 154(b) by 0 days.

(21) Appl. No.: 09/272,858

(22) Filed: Mar. 19, 1999

(51) Int. Cl.[7] .................................................. H02H 9/00
(52) U.S. Cl. .......................................... 361/56; 257/355
(58) Field of Search ........................... 361/56, 111, 119, 361/91.1, 90; 257/355–360

(56) References Cited

U.S. PATENT DOCUMENTS 5,745,323 A * 4/1998 English et al. ................ 361/56
5,946,177 A * 8/1999 Miller et al. .................. 361/56
5,956,219 A * 9/1999 Maloney ...................... 361/56

OTHER PUBLICATIONS

"Electrostatic Discharge (ESD) in Integrated Circuits", Continuing Education in Engineering, University Extension, University of California.
Berkeley, San Francisco, CA (Sep.–Oct., 1996).

* cited by examiner

*Primary Examiner*—Ronald W. Leja
(74) *Attorney, Agent, or Firm*—Vedder, Price, Kaufman & Kammholz

(57) ABSTRACT

An electrostatic discharge circuit utilizes a cascaded transistor configuration and a dual ESD protection circuit configuration. Preferably, the ESD protection circuits are made as a single gate oxide circuit. The protection circuit is effectively disabled during normal operation and allows a variable level voltage input to be applied during normal operation without damage to the cascaded transistors.

18 Claims, 4 Drawing Sheets

200

CIRCUIT TO PROTECT (E.G, I/O PAD, POWER OR GROUND PAD, CORE LOGIC ETC.)

NODE OR PAD 12 14 16 220a 204 210 VREF1 220b 208 130 202 212 220c 132 VREF2 220d 206 214 134 114

SINGLE GATE OXIDE ELECTROSTATIC DISCHARGE PROTECTION CIRCUIT

FIELD OF THE INVENTION

The invention relates generally to over voltage protection circuits for protecting other circuits from higher than desired voltage levels, and more particularly to electrostatic discharge (ESD) protection circuits for protecting an input to a protected circuit.

BACKGROUND OF THE INVENTION

There is a constant challenge to continuously design smaller, faster and more complicated integrated circuits to provide increased functionality for multimedia applications and other applications. With the continued demand for higher speed and lower power consumption integrated circuits a need exists for simple, low cost and reliable over voltage protection circuits. Graphics controller chips, like many integrated circuit devices, utilize CMOS, logic cores, and associated I/O pads as part of their circuit makeup. I/O pads can include, for example, input/output buffers coupled to a common pad or pin. For example, CMOS based video graphics chips with 128 input/output ports (I/O ports) are required to operate at clock speeds of 125 MHz to 250 MHz or higher. Such devices may use a 2.5 V or 1.8 V power supplies for much of their logic to reduce power consumption. One way to increase the operating speed of such devices is to decrease the gate length of core circuitry transistors. However, a decrease in the gate length and gate oxide thickness of MOS devices can reduce safe operating voltage to lower levels.

For example, where an integrated circuit contains digital circuitry that operates from a 1.8 V source and is fabricated using silicon dioxide gate thickness of 30 Angstroms, a resulting safe operating voltage may be approximately 2.8 V. Such IC's must often connect with more conventional digital devices that operate at 5 V or 3.3 V. A problem arises when the core logic circuitry (operating at 1.8 V) receives 5 V digital input signals from peripheral devices on input pins (or I/O pins). Such standard 5 V input signals or 3.3 V input signals can cause damage if suitable voltage protection is not incorporated. Also, smaller devices can be more susceptible to electrostatic discharges that are received on power pads, input/output pads (I/O pads) or other pads.

As is known, input/output pads and power pads on integrated circuits require some form of ESD protection circuitry. A principal role of such circuits is to sink current from the ESD source to decrease a voltage level applied to the node or pad. As smaller gate oxide thicknesses are used to increase speed and density of integrated circuits, protecting against ESD damages becomes more difficult. In addition to withstanding ESD energy, single gate oxide transistors must also withstand varying supply voltage operating ranges. For example, external circuits may provide 5 V input signals during normal operating modes. Although a combination of thick gate and thin gate devices can make it easier to design ESD protection circuitry, it introduces another gate thickness and increases the number of processing steps required to fabricate the IC. This adds to the expense of the integrated circuit. In addition, dual gate oxide protection circuits such as those using 1.8 V or 3.3 V supply voltages typically cannot withstand a 5 V signal during normal operation.

As shown in FIG. 1, a conventional ESD protection circuit 10 is shown that may be used, for example, with a 3.3 V supply voltage. The circuit 10 protects a circuit to be protected 12 such as an input/output (I/O) prebuffer, buffer circuitry, core logic or any other suitable logic, which receives an input signal or generates an output signal on a node 14. The node 14 may be connected to a pad 16 that may, if desired, be accessible to an external integrated circuit. The ESD protection circuit 10 includes a low pass filter 18 that includes a capacitor 20 and a resistor 22. An nmos transistor 24 has its gate connected to the node between the capacitor and resistor. Such a circuit may be useful, for example, with thick gate oxide devices that, for example, accommodate a 3.3 V core logic voltage or node voltage. However, when a lower supply voltage is used for the core logic such as 2.5 V or 1.8 V, the circuit to be protected must also be compatible typically with a higher input signal (5 V) or 3.3 V input signal to interface with older external circuits. With a single gate oxide device used as part of an ESD protection circuit, and having, for example, a 0.25 micrometer length and 50 Å gate thickness, when a 5 V input voltage is applied to the pad, the transistor 24 will receive an excessive gate to source voltage during normal operation which over time can degrade the electrostatic discharge protection device. Accordingly, it would be desirable to have a circuit that is relatively inexpensive that utilizes a single gate oxide design to reduce costs while also allowing suitable protection against electrostatic discharge damage. Moreover, it would be advantageous if the electrostatic protection circuitry were effectively disabled during normal operations so that current is not drawn unnecessarily.

Consequently there exists a need for an ESD protection circuit that can be used for low supply voltage circuits while also withstanding higher input signal voltages. It would desirable if the protection circuit were a single gate oxide circuit.

DETAILED DESCRIPTION OF A PREFERRED EMBODIMENT OF THE INVENTION

Briefly, an electrostatic discharge protection circuit utilizes a cascaded transistor configuration and a dual ESD protection circuit configuration. Preferably, the ESD protection circuits are made as a single gate oxide circuit. The ESD protection circuit is effectively disabled during normal operation and allows a variable level voltage input to be applied during normal operation without damage to the cascaded transistors by providing ESD protection circuit gate to drain or gate to source voltages within normal operating voltage.

In one embodiment, a first ESD control circuit is coupled to a first single gate oxide transistor and a second ESD control circuit is coupled to a second single gate oxide transistor. The first ESD control circuit includes an ESD voltage dividing circuit and the second ESD control circuit includes an ESD voltage sensing circuit. The ESD control circuits are also single gate oxide devices. In one embodiment the single gate oxide thickness of the devices may be 30 Angstroms or less.

Figure 1:
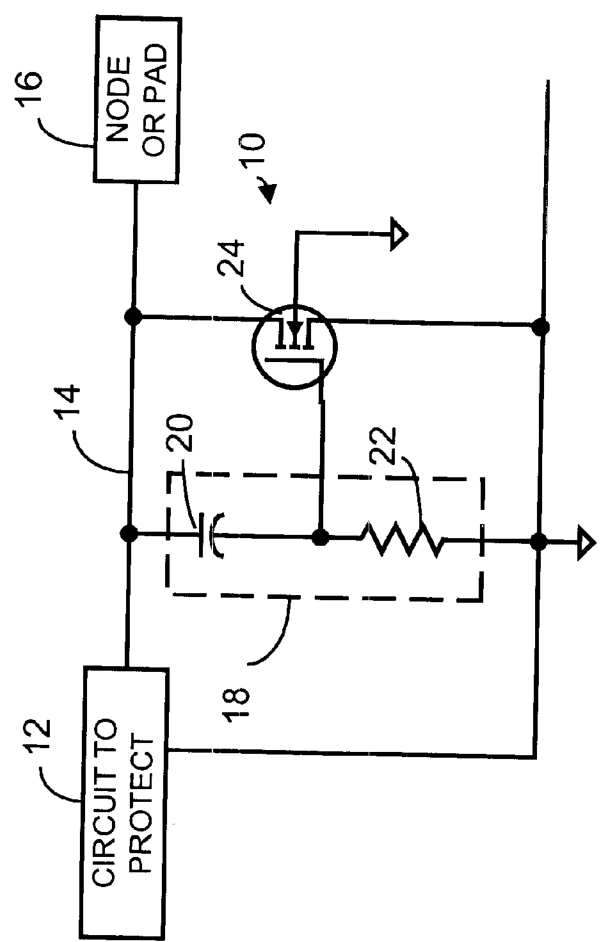
FIG. 1 is a schematic diagram illustrating a prior art electrostatic energy protection circuit.
Figure 2:
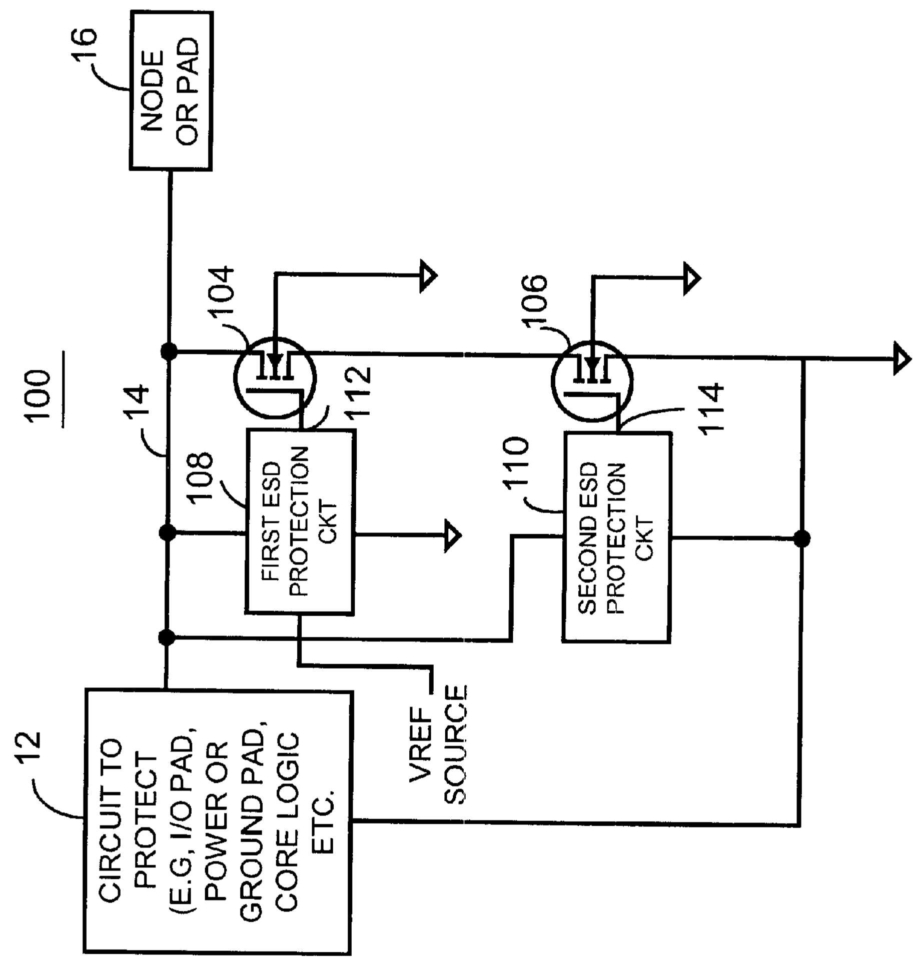
FIG. 2 is a schematic diagram illustrating an example of one embodiment of an electrostatic discharge protection circuit in accordance with the invention.

FIG. 2 illustrates one embodiment of an electrostatic discharge protection circuit 100 having a cascaded transistor configuration 102 wherein a first transistor 104 is operatively cascaded to a second cascaded transistor 106. The cascaded transistor configuration 102 is operably coupled to node 14 that receives an electrostatic discharge potential and/or a variable level input voltage during normal operation. The cascaded transistors 104 and 106 may be MOSFET nmos transistors, bipolar transistors, CMOS transistors, or any other suitable transistors if desired.

The electrostatic discharge protection circuit 100 also includes a first ESD control circuit 108 that is operatively coupled to the first transistor 104. In addition, a second ESD control circuit 110 is operatively coupled to or may include the second cascaded transistor 106. The first ESD protection circuit 108 is operatively coupled to the node 14 and receives, during normal operation, a reference voltage 112 from a reference voltage source as well as provides another voltage that is enough to turn "ON" transistor 104 during ESD conditions. The ESD protection circuit also receives the ESD energy through node 14.

The second ESD protection circuit 110 is also coupled to receive the electrostatic discharge energy. The second ESD protection circuit generates a control signal 114 for cascaded transistor 106 primarily only during an ESD condition or overvoltage condition. The first ESD control circuit 108 serves as an ESD voltage dividing circuit. The second ESD control circuit 110 serves as an ESD voltage sensing circuit.

Figure 3:
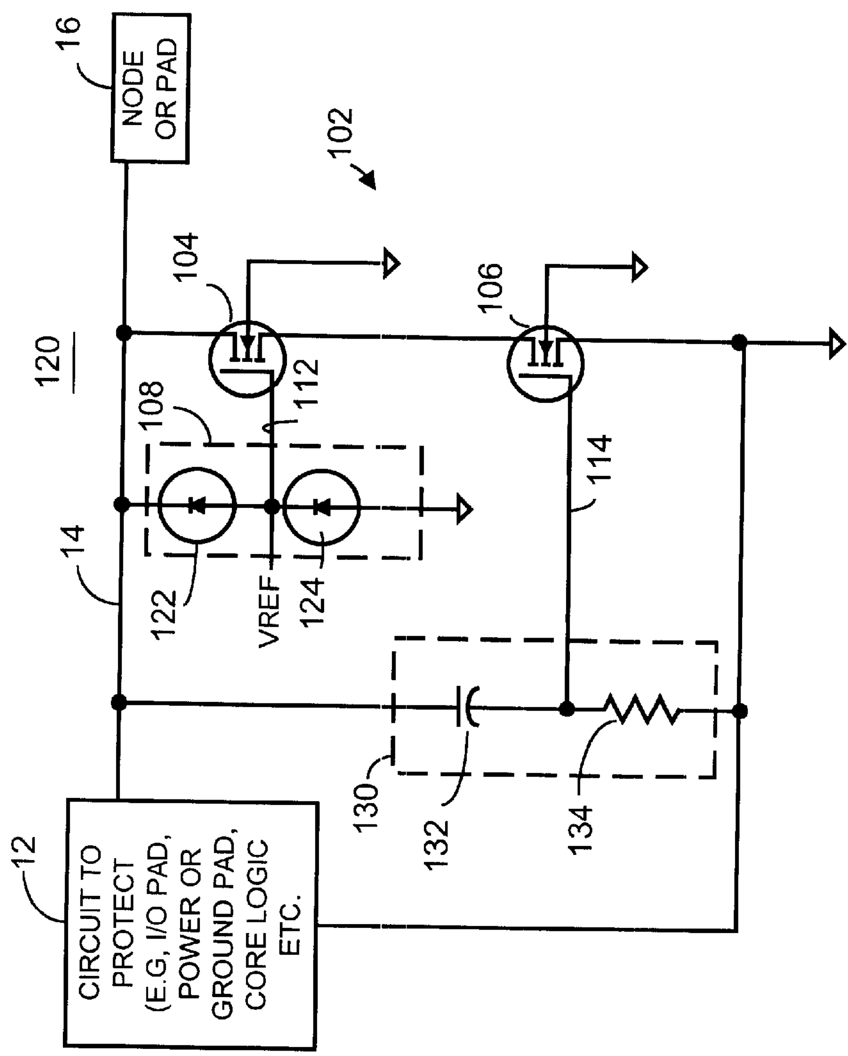
FIG. 3 is a schematic diagram illustrating an example of one embodiment of an electrostatic discharge protection circuit in accordance with the invention.

FIG. 3 shows an embodiment of an electrostatic discharge protection circuit 120 wherein the first ESD protection circuit 108 includes a plurality of impedance elements connected in series serving as a voltage divider. One example of an impedance element is a CMOS diode 122 connected in series with another CMOS diode 124. The diode 122 has a cathode operatively coupled to the node 14 and an anode operatively coupled to an input of the first transistor 104, namely a gate of transistor 104. The diode 124 has a cathode operatively coupled to the input of the transistor 104 and to the anode of diode 122. The anode of diode 124 is also coupled to ground. The diode 122 may be a suitably configured MOS transistor, or any other suitable impedance device (or rectification device) where the impedance elements are nmos transistors configured as diodes. Preferably, the diffusion area of diode 122 is approximately twice that of the diffusion area of diode 124. This helps insure that the transistor 104 is on during the ESD pulse and also has larger a parasitic capacitance than the diode 124. A reference voltage 112 is set to facilitate, during normal operation, a suitable gate to source voltage that is within the normal operating range of the device 104. For example, where an input voltage on node 14 is 5 V, the reference voltage may be set to approximately 2.5 V to insure a suitable gate to source and gate to drain voltage. Due to the small leakage currents of the diodes 122 and 124, the voltage divider serves as a high impedance voltage divider during normal operating mode and draws very little current. During ESD protection mode, the rectifier based voltage divider suitably grounds negative ESD voltages, as well as provides voltage that is enough to turn "ON" transistor 104 during positive ESD voltages.

As shown, the transistor 104 has a drain operatively coupled to the node 14 that receives the ESD voltage and has a source operatively coupled to a drain of the cascaded transistor 106. It will be recognized that additional components may be placed in between the node and transistors 104, 106 and ESD protection circuits 106 and 110 if desired.

The ESD sensing circuit 110 includes a high pass ESD filter circuit 130, having a capacitive element 132 operatively coupled between the node 14 and an input of the second transistor or transistor 106. In this instance, one end of the capacitor element 132 is coupled to the gate of the cascaded transistor 106. The ESD filter circuit 130 also includes a resistive element 134 operatively coupled to the capacitive element to form a filter. In this embodiment, the resistive element has one end coupled to one end of capacitive element 132 and the gate of transistor 106. Another end of the resistive element 134 is coupled to ground. As such, the resistive element is coupled to the input (e.g., gate) of the second transistor and to ground. The capacitive element 132 may be any suitable element providing capacitance and have a capacitance of approximately 1 pF. The resistive element 134 may be formed, for example, on an integrated circuit by diffusion or it may be a poly resistor.

The ESD control circuit 108 is made up preferably of only single gate oxide devices such that the diodes 122 and 124 along with transistors 104 and 106 all have the same gate oxide thickness. The capacitor may be formed by using poly and metal layers as known in the art. As shown, the reference voltage 112 (VREF) in this embodiment is approximately one half of the normal operating voltage on node 14. Where node 14 can range between 0 and 5V, V ref would be at a maximum of approximately 2.4–2.6 V. The nmos transistor 104 is off during normal operation since nmos transistor 106 is also off during normal operation. In this embodiment, the normal operating voltages may be 5 V, 3.3 V or 2.5 V. As such, the single gate oxide devices such as single gate oxide thicknesses of transistors 104 and 106 and diodes 122 and 124 may be approximately 50 Å where the circuit to protect has a supply voltage of approximately 2.5 V.

Figure 4:
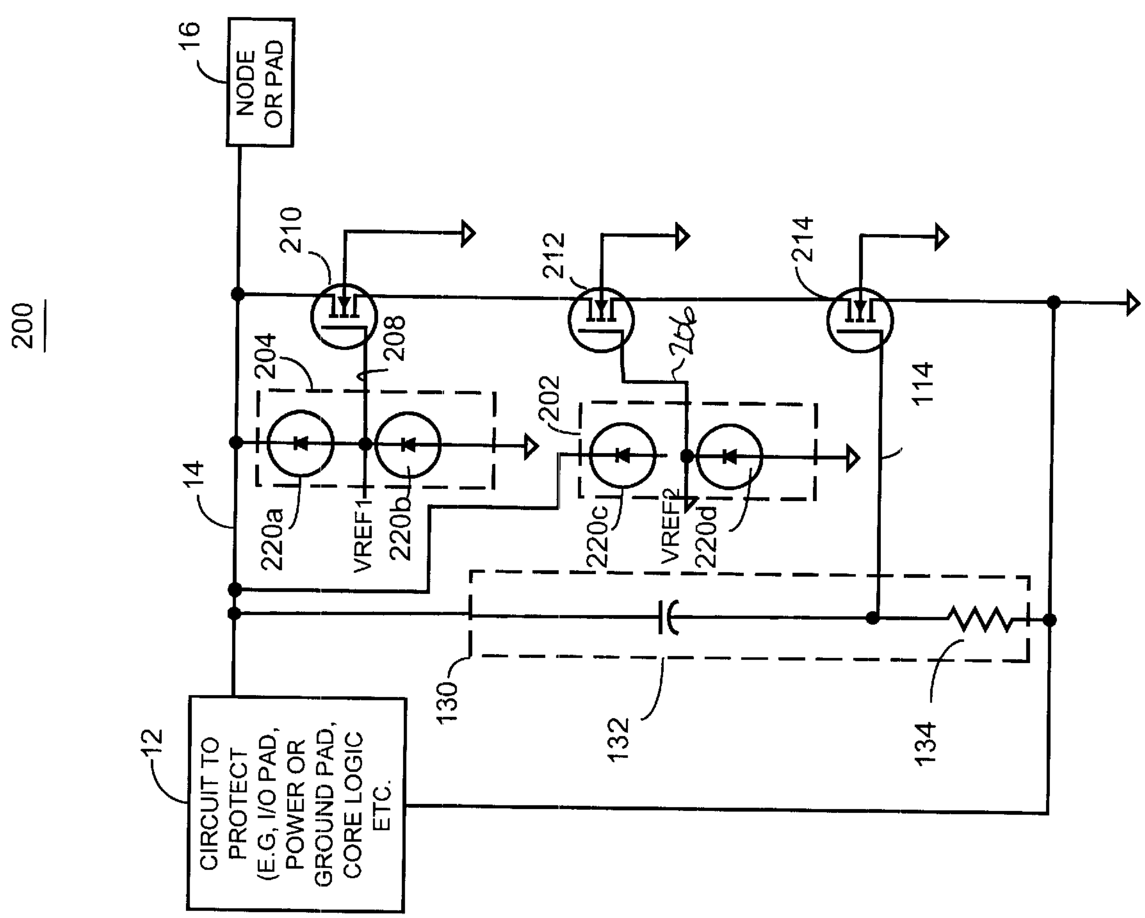
FIG. 4 is a schematic diagram illustrating another example of an embodiment of an electrostatic discharge protection circuit in accordance with the invention.

FIG. 4 illustrates another embodiment of the invention suitable, for example, with a 1.8 V voltage input or output signal on node 14 or a 1.8 V supply to core circuitry that is to be protected. The electrostatic protection circuit 200 is similar to that shown in FIG. 3 except for an additional reference voltage cascaded transistor in a cascaded transistor configuration and an additional ESD voltage divider circuit. As shown, a plurality of ESD control circuits 202 and 204 are used in connection with a third ESD control circuit such as the ESD sensing circuit 110. The ESD control circuits 202 and 204 may be, for example, ESD voltage dividing circuits similar to ESD voltage dividing circuit 108. In this embodiment, a first ESD based reference voltage 206 is set by the voltage divider circuit 202 and a second reference voltage 208 is set by ESD voltage dividing circuit 204. In addition, during normal operations voltage reference sources provide $V_{ref1}$, and $V_{ref2}$. A reference voltage ($V_{ref}$) source provides a reference voltage such as 3.3 V, for example, to a cascaded nmos transistor 210, which is cascaded with initial nmos transistors 212 and 214 as shown. Cascaded nmos transistor 212 receives as input on its gate, the second reference voltage 206 set by ESD voltage dividing circuit 202 during ESD energy activity and receives a normal operating mode reference voltage of about 1.8 V during normal operations. The logic high voltage on the pad 16 during normal operation, for example, may be 5 V, 3.3 V or 1.8 V. As such, depending upon the supply voltage of the core supply or circuit to be protected and the peripheral circuitry to which the ESD protection circuit is coupled, the voltage on the pad 16 may be, for example, 5 V, 3.3 V, 2.5 V or 1.8 V. With the reference voltage 208 set at approximately 3.3 V and the reference voltage 206 set at approximately 1.8 V, the source to drain voltage for the cascaded transistors 210 and 212 do not exceed maximum operating thresholds during normal operations. In addition, the impedance elements 220*a*–220*d*, such as diodes or other suitable impedance elements, along with the cascade transistors 210–214 are single gate oxide devices which may be, for example, 0.18 micrometer gate length devices or devices having approximately 30 Å gate oxide thicknesses. Preferably, the reference voltages 206 and 208 are soft. For example, the reference voltages come from a source that is not directly connected to a supply voltage line and instead passes through an isolation transistor as known in the art. However, any suitable reference voltage may be used.

It will be recognized by one of ordinary skill in the art, that nmos devices such as PMOS and other non-MOS devices may also be used in the circuit if desired. In addition, the disclosed invention may be applied to accommodate additional voltage ranges. For example, additional cascading may be used to accommodate a larger voltage range of input voltage or output voltages seen on node 14.

It should be understood that the implementation of other variations and modifications of the invention in its various aspects will be apparent to those of ordinary skill in the art, and that the invention is not limited by the specific embodiments described. It is therefore contemplated to cover by the present invention, any and all modifications, variations, or equivalents that fall within the spirit and scope of the basic underlying principles disclosed and claimed herein.

What is claimed is:

1. An electrostatic discharge (ESD) protection circuit comprising:

a cascaded NMOS transistor configuration including at least a first NMOS transistor operatively cascaded to a second NMOS transistor wherein the cascaded transistor configuration is operatively coupled to a node that receives an electrostatic discharge;

a single gate oxide ESD control circuit operatively coupled to the first NMOS transistor and operative to turn on the first NMOS transistor during an ESD event; and an ESD control circuit operatively coupled to the second NMOS transistor and operative to turn the second NMOS transistor on during an ESD event and to turn off the second NMOS transistor during normal operation.

2. The ESD circuit of claim 1 wherein the single gate oxide ESD control circuit includes an ESD voltage dividing circuit where every component of the dividing circuit is in an off state during normal operation.

3. The ESD circuit of claim 2 wherein the ESD voltage dividing circuit includes a first diode having a first cathode operatively coupled to the node and a first anode operatively coupled to an input of the first NMOS transistor and a second diode having a second cathode operatively coupled to the input of the first NMOS transistor and a second anode operatively coupled to ground.

4. The ESD circuit of claim 2 wherein the ESD voltage dividing circuit is comprised of single gate oxide devices that each have a gate thickness of 30 angstroms or less.

5. The ESD circuit of claim 1 wherein the ESD control circuit includes an ESD voltage sensing circuit including a high-pass ESD filter circuit.

6. The ESD circuit of claim 5 wherein the ESD voltage sensing circuit includes a capacitive element operatively coupled between the node and an input of the second NMOS transistor and a resistive element operatively coupled between the input of the second NMOS transistor and ground.

7. An electrostatic discharge (ESD) protection circuit comprising:

a cascaded NMOS transistor configuration including at least a first NMOS transistor operatively cascaded to a second NMOS transistor wherein the cascaded NMOS transistor configuration is operatively coupled to a node that receives an electrostatic discharge;

a single gate oxide ESD control circuit operatively coupled to the first NMOS transistor having an ESD voltage dividing circuit and operative to turn on the first transistor during an ESD event wherein every component of the ESD dividing circuit is in all off condition during normal operation;

an ESD control circuit operatively coupled to the second NMOS transistor aid operative to turn on the second NMOS transistor during an ESD event and to turn off the second NMOS transistor during normal operation, and having a high pass filter circuit.

8. The ESD circuit of claim 7 wherein the first and second NMOS transistors are made of single gate oxide devices.

9. The ESD circuit of claim 8 wherein the single gate oxide devices each have a gate thickness of 30 angstroms or less.

10. The ESD circuit of claim 7 wherein the ESD voltage dividing circuit includes a first diode having a first cathode operatively coupled to the node and a first anode operatively coupled to an input of the first NMOS transistor and a second diode having a second cathode operatively coupled to the input of the first NMOS transistor and a second anode operatively coupled to ground.

11. The ESD circuit of claim 10 wherein the high pass filter circuit includes a capacitive element operatively coupled between the node and an input of the second transistor and a resistive element operatively coupled between the input of the second NMOS transistor and ground.

12. An electrostatic discharge ESD protection circuit comprising:

a cascaded NMOS transistor configuration including at least a first NMOS transistor operatively cascaded to a second cascaded NMOS transistor and a third cascaded NMOS transistor wherein the cascaded NMOS transistor configuration is operatively coupled to a node that receives an electrostatic discharge;

a first single gate oxide ESD control circuit operatively coupled to the first NMOS transistor having an ESD voltage dividing circuit, a second single gate oxide ESD control circuit operatively coupled to the second NMOS transistor having an ESD voltage dividing circuit; and an ESD sensing circuit operatively coupled to the third NMOS transistor.

13. The ESD circuit of claim 12 wherein the first, second and third transistors, the first ESD control circuit, and the second ESD control circuit are made of single gate oxide devices.

14. The ESD circuit of claim 13 wherein the ESD sensing circuit includes a high pass ESD filter circuit.

15. The ESD circuit of claim 13 wherein the ESD sensing circuit includes a capacitive element operatively coupled between the node and an input of the third transistor and a resistive element operatively coupled between the input of the third transistor and ground.

16. The ESD circuit of claim 13 wherein the single gate oxide devices each have a gate thickness of 30 angstroms or less.

17. The ESD circuit of claim 12 wherein the first ESD voltage dividing circuit includes a first diode having a first cathode operatively coupled to the node and a first anode operatively coupled to an input of the first NMOS transistor and a second diode having a second cathode operatively coupled to the input of the first NMOS transistor and a second anode operatively coupled to ground and wherein the second ESD voltage dividing circuit includes a third diode having a third cathode operatively coupled to the node and a third anode operatively coupled to an input of the second NMOS transistor and a fourth diode having a fourth cathode operatively coupled to the input of the second NMOS transistor and a fourth anode operatively coupled to ground.

18. The ESD circuit of claim 17 wherein a depletion area of the first diode is approximately twice the depletion area of the second diode.

* * * * *